(12) United States Patent
Garabedian et al.

(10) Patent No.: US 7,365,553 B2
(45) Date of Patent: Apr. 29, 2008

(54) PROBE CARD ASSEMBLY

(75) Inventors: Raffi Garabedian, Monrovia, CA (US); Nim Hak Tea, Orange, CA (US); Steven Wang, Hacienda Heights, CA (US); Heather Karklin, San Francisco, CA (US)

(73) Assignee: Touchdown Technologies, Inc., Baldwin Park, CA (US)

( * ) Notice: Subject to any disclaimer, the term of this patent is extended or adjusted under 35 U.S.C. 154(b) by 145 days.

(21) Appl. No.: 11/317,408

(22) Filed: Dec. 22, 2005

(65) Prior Publication Data

US 2007/0145988 A1    Jun. 28, 2007

(51) Int. Cl.
  *G01R 31/02*  (2006.01)
  *G01R 1/073*  (2006.01)
(52) U.S. Cl. .................................. 324/758; 324/754
(58) Field of Classification Search ................ None
  See application file for complete search history.

(56) References Cited

U.S. PATENT DOCUMENTS

| 4,382,228 | A | * | 5/1983 | Evans ..................... 324/758 |
| 5,974,662 | A | * | 11/1999 | Eldridge et al. ............. 29/842 |
| 6,677,771 | B2 | * | 1/2004 | Zhou et al. ................ 324/758 |
| 6,784,678 | B2 | * | 8/2004 | Pietzschmann ............. 324/758 |
| 7,074,072 | B2 | * | 7/2006 | Huebner .................... 439/482 |
| 7,075,319 | B2 | * | 7/2006 | Mori ........................ 324/754 |

FOREIGN PATENT DOCUMENTS

| EP | 0567332 A2 | 10/1993 |
| WO | WO 2004/056698 A2 | 7/2004 |

OTHER PUBLICATIONS

Jun-Bo Yoon et al.; "Monolithic Integration of 3-D Electroplated Microstructures With Unlimited Number of Levels using Planarization With A Scarificial Metallic Mold (PSMM)", Twelfth IEEE International Conference on Micro Electro Mechanical Systems; 1999 MEMS; Jan. 17-21, 1999; pp. 624-629.

* cited by examiner

*Primary Examiner*—Ernest Karlsen
(74) *Attorney, Agent, or Firm*—Pillsbury Winthrop Shaw Pittman LLP

(57) ABSTRACT

A probe card assembly has a probe contractor substrate having a plurality of probe contractor tips thereon and a probe card wiring board with an interposer disposed between the two. Support posts contacting the probe contractor substrate are vertically adjustable until secured by a locking mechanism which is coupled to the probe card wiring board. When the posts are secured in a fixed position, the position is one in which the plane of the plurality of probe contractor substrates is substantially parallel to a predetermined reference plane.

40 Claims, 13 Drawing Sheets

300

400

600

PROBE CARD ASSEMBLY

BACKGROUND OF THE INVENTION

1. Field of the Invention

Embodiments of the present invention are directed to a probe card assembly and more particularly to a method and apparatus for providing a probe card assembly with a precisely fixed probe substrate position relative to the reference plane of the probe card.

2. Description of Related Art

A modem probe card assembly used to test wafers of semiconductor chips generally consists of a Printed Circuit Board (PCB) (also referred to as a printed wiring board or probe card wiring board), a probe contractor substrate having probes for contacting the wafer (sometimes referred as a probe head), and an interposer connecting the PCB to the probe contractor substrate.

Probes (also referred to as probe contactors) are generally compliant mechanisms including at least one spring which have some limited range of compliance in a vertical direction (the "z" direction). Some probes have minimal or no compliance. When in use, a wafer under test is urged upward to contact the tips of the probes. In practice, there is some manufacturing process-related z error (non-planarity of the probe tips) caused by film stresses, etch control, assembly control, etc. as well as systemic z errors caused by a warping or curving in the surface of the probe contractor substrate. If the probe contractor substrate is curved or warped, so will be the imaginary surface that goes through the tips (assuming that the probes are of uniform height). Thus some probe tips will contact the wafer first (called the first touch z height) and some probe tips will contact the wafer last (last touch z height). Because probes generally have a limited range of compliance (as small as 50 μm or less for many microfabricated technologies), it is desirable to minimize both the process-related and systemic errors in tip z height. Some errors are most directly related to the fabrication of the probes on the probe contractor substrate rather than the probe card assembly design. However, some errors are usually directly related to the probe card assembly and the way the PCB is mounted with the probe contractor substrate or substrates. The minimization of these latter errors is the subject of the present invention.

In older probe card applications, a prober has a surface which has been planarized to that of the chuck that carries the wafer under test. The probe card PCB is generally mounted to this planarized surface of the prober. Thus, all such probe card assemblies require well controlled parallelism between the plane of the probe tips (the best-fit plane that minimizes the overall root-mean-square z error between the probe tips and the plane) and the plane of the PCB (the PCB can be thought of as the "reference plane." If the probe tips are co-planar with the PCB, then they are also co-planar with the chuck, and thus with the wafer under test). Such a design will lead to a more uniform contact of the probes to the wafer under test (less of a distance between first touch z distance and last touch z distance). In newer probe cards, the probe tips are referenced to mounting points on the probe card which are typically kinematic mounts of some type (used here to describe a mount that provides accurate and repeatable mechanical docking of the probe card into the test equipment and provides constraint in at least the three degrees of freedom necessary to achieve parallelism to the plane of the wafer chuck). In either embodiment, it is necessary to align the tips of the probe contactors such that they are parallel to a reference plane which is itself parallel to the plane of the wafer chuck.

There are two common ways that a probe contractor substrate may be mounted to the probe card assembly (which includes the PCB, an associated stiffener ring and/or other mechanical elements) in a planar manner: Fixed Probe Card Assemblies (FPCAs) and Adjustable Probe Card Assemblies (APCAs). FPCAs provide for design simplicity (no moving or adjustable parts) and relatively low cost. However, the machining tolerances required for parallelism, particularly in the case of large area probe cards, can be difficult to achieve. Hence, in practice, shims are often used to provide some degree of adjustability during assembly. Shimming; though a practical alternative, is difficult to perform accurately in a manufacturing environment to the tolerances required (on the order of microns).

FPCAs include typical "Buckling Beam" assemblies, such as that shown FIG. 1A and described in U.S. Pat. No. 3,806,801 entitled "Probe Contractor Having Buckling Beam Probes." Buckling Beam assemblies have a vertical buckling beam probe head, a PCB, and an interposer situated between the probe head and the PCB. In this case the interposer comprises an array of solder balls which electrically connect the substrate to the PCB (terminal to terminal) but other examples are well known in the art where the interposer connects the substrate to the PCB by means of spring-pins. In another version of the Buckling Beam probe card, there is no interposer and the buckling beams connect directly to the terminals of the PCB.

In either type of Buckling Beam assembly the probe head is made to be parallel to the PCB surface by first machining the head so that the surfaces are parallel, and second by shimming between the head and the PCB. It is also common practice in the art to mount the probe card and lap the probe tips parallel to the mount, though this technique introduces unwanted damage to the probe tips and is not practical for coated probes (probes with a thin coating of material that is different from the base spring material).

APCAs are well known in the art and range from providing for small groups of adjustable pins to entire probe-bearing substrates panels or assemblies which are adjustable in place relative to the card's reference plane. The unifying characteristic is that a mechanism is provided for moving groups of probes relative to the probe card reference plane while maintaining electrical contact between them. The advantage of adjustability is that parallelism can be readily achieved, even in the field between uses or during use. However adjustability also has a number of significant disadvantages including drift of the adjustment over time and thermal cycling, cost of the relatively complex precision mechanical assemblies required and difficulty of assembly. Furthermore, the adjustment mechanism can take significant space and limit the density of adjacent blocks of probes.

U.S. Pat. No. 5,974,662 entitled "Method of Planarizing Tips of Probe Elements of a Probe Card Assembly," as shown in FIG. 1B, describes such an APCA and discloses a method of making a probe card with an adjustment of the probe tips relative to the probe card assembly's reference plane. The assembly incorporates a space transformer substrate which is mounted to the probe card in such a way that the orientation can be adjusted. A vertical spring interposer is used to electrically interconnect the probe contractor substrate to the PCB and differential screws bearing on the substrate provide the adjustability. This particular design is particularly expensive, difficult to assemble, and complex.

In addition, the large number of mechanical components required to achieve adjustability make the design inherently thermally unstable.

In some cases, it is desirable to have multiple "tiles" of probe card substrates (each with a plurality of probes) attached to the PCB. The assembly of probe card substrates of onto larger assemblies may be accomplished in a variety of ways. Most of these assemblies fall into one of two categories: Fixed Assemblies where the substrates are individually fixed to a carrier without further alignment; and Aligned Assemblies where the substrates are mounted to the card on an adjustable leveling mechanism. Fixed assemblies rely on the tolerances of the various elements and the tooling used to set the overall tolerance of contact points on the various substrates relative to one another. For reference, the desired tolerance in all three orthogonal directions is on the order of ±5 μm, which number is very difficult to achieve through a fixed assembly. U.S. Patent Publication No. 20040163252, assigned to Form Factor International, is an example of a fixed assembly, as shown in FIG. 2A.

Adjustable assemblies typically require some form of macroscopic adjustable mount with a full six degrees of freedom in order to align substrates relative to one another. The trouble with this method is that the mount is relatively large (so that it does not fit in the conventional envelope provided for probe cards) cumbersome, expensive and unstable (i.e. drifts in position as a function of time, particularly when exposed to thermal excursions). U.S. Pat. No. 5,091,694 entitled "Quartz Probe Apparatus," is an example of an adjustable assembly, as shown in FIG. 2B.

Thus, what is needed is an improved probe card assembly and less expensive, yet stable method of planarizing the probe head(s) to the PCB or other reference plane for such a probe card assembly.

BRIEF SUMMARY OF THE INVENTION

An embodiment of the current invention provides for a new class of probe card assembly that is not a FPCA or an APCA. Instead of relying on shims or other similar means to achieve initial parallelism in the assembly process, it provides for a mechanism to align a probe-bearing substrate into parallel position and semi-permanently lock it into that position. Because of the locking mechanism, the substrate position and orientation is not adjusted once it is mounted in position. An advantage of a semi-permanent locking mount is that it is mechanically and thermally stable relative to an adjustable mount. Also, the semi-permanent mount is less expensive to build.

The semi-permanent mount has the characteristics of being easily assembled and disassembled in case service or repair of the probe card is necessary. Some parts of the mounting mechanism may be single-use and need replacement each time the probe card is re-assembled.

Another embodiment of the current invention provides for a semi-permanent, aligned but non-adjustable mount of a plurality of probe substrates to a superstructure. The alignment method disclosed provides for extremely high mechanical precision of substrate location without the cost, complexity and size of a fully-adjustable mechanical mount per substrate.

DETAILED DESCRIPTION OF THE INVENTION

Figure 1A:
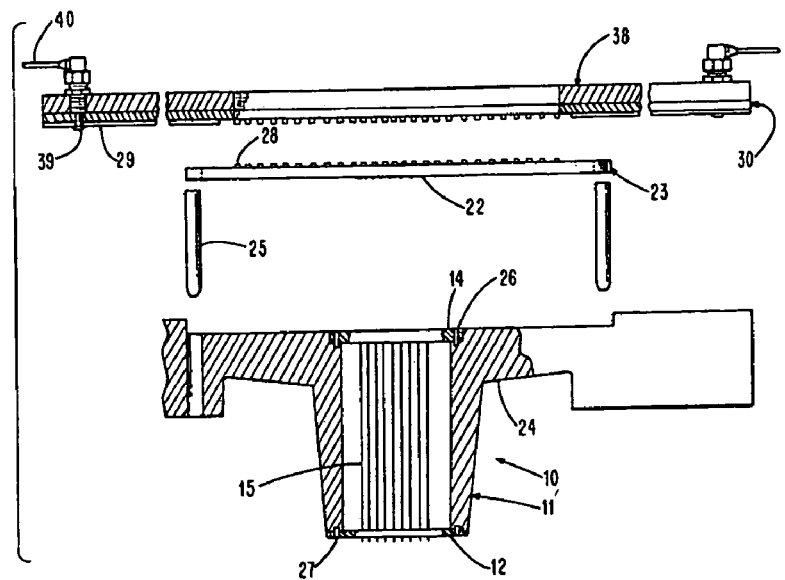
FIG. 1A illustrates a fixed probe card assembly as is known in the art.
Figure 1B:
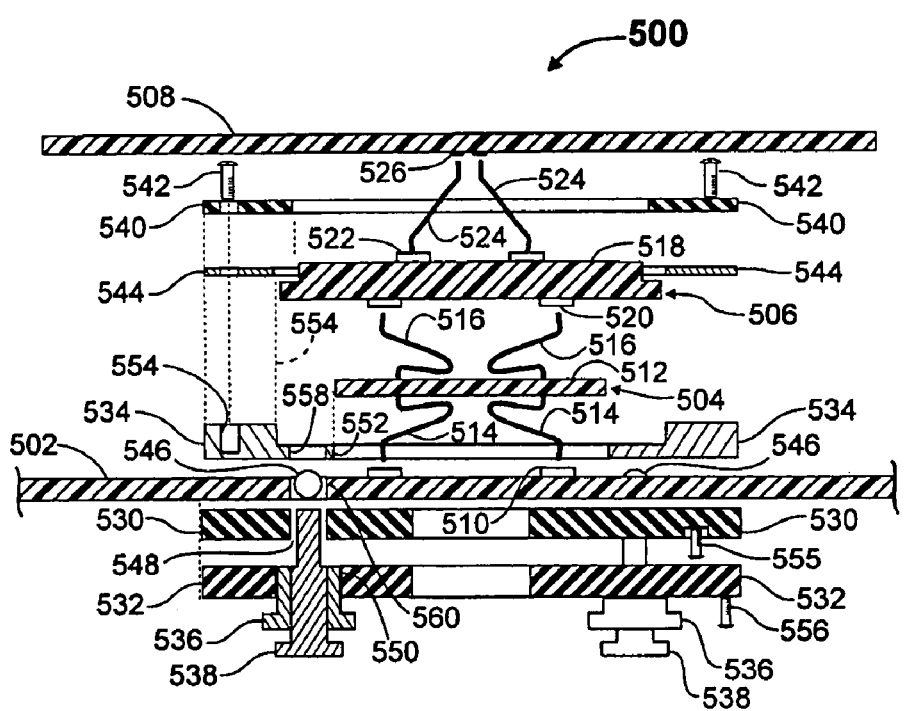
FIG. 1B illustrates an adjustable probe card assembly as is known in the art.
Figure 2A:
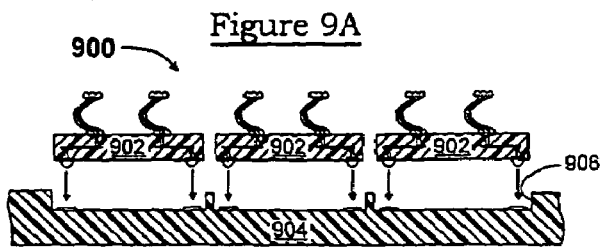
FIG. 2A illustrates a fixed probe card assembly for a plurality of substrates as is known in the art.
Figure 2A:
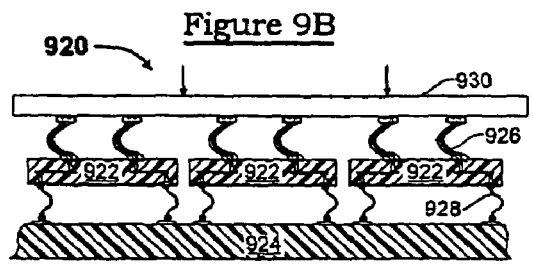
Figure 2A:
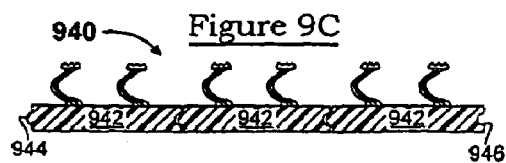
Figure 2B:
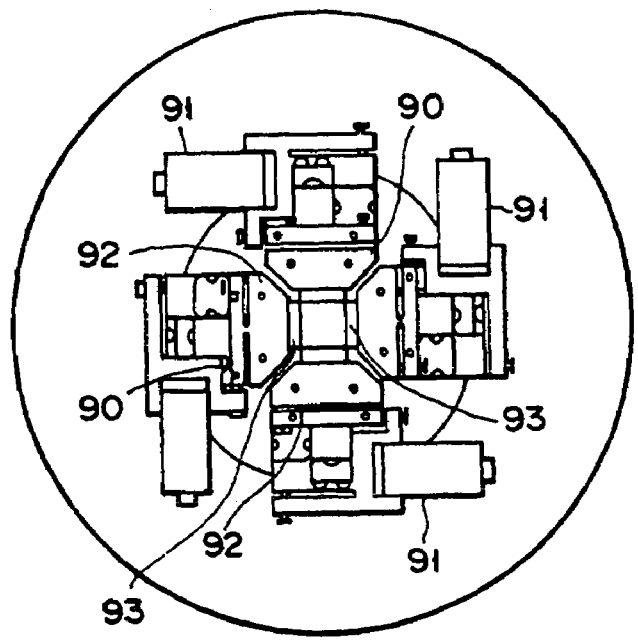
FIG. 2B illustrates an adjustable probe card assembly for a plurality of substrates as is known in the art.
Figure 3:
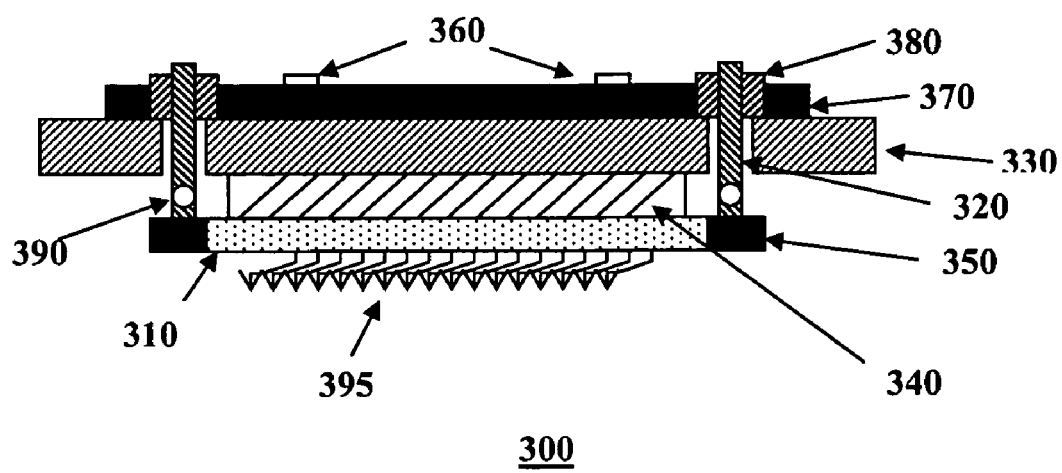
FIG. 3 illustrates a probe card assembly according to an embodiment of the present invention.

FIG. 3 illustrates a probe card assembly 300 having a semi-permanent mount according to an embodiment of the present invention. As shown in FIG. 3, the probe card assembly is comprised of a probe contractor substrate 310 having support structures, illustrated as support posts 320, coupled thereto. The probe contractor substrate 310 is assembled so as to be coupled to the printed circuit board ("PCB") 330 with a compliant interposer 340 in place. The contractor substrate 310 is aligned with the reference points 360 in an orientation such that the probe contactors' 395 tips are in a plane that is parallel to plane formed by the reference points 360. The reference points 360 in FIG. 3 are of the kinematic mountings points variety as discussed earlier, however, it is important to note that if the probe card assembly does not have such mounting points 360, then the probe contactors' 395 tips are in a plane that is parallel to another reference plane such as that of the bottom surface of PCB 330. Once the substrate 310 is properly aligned, it is assembled to a stiffener ring 370 by means of a fixed lock such as locking collar 380, which works to securely affix the top of the support posts 320 in their positions. Alternatively, the fixed lock may be any one of a number of locking mechanisms including but not limited to an adhesive bond, a lateral set screw arrangement, a collet arrangement and any other locking mechanism known in the art.

Figure 5:
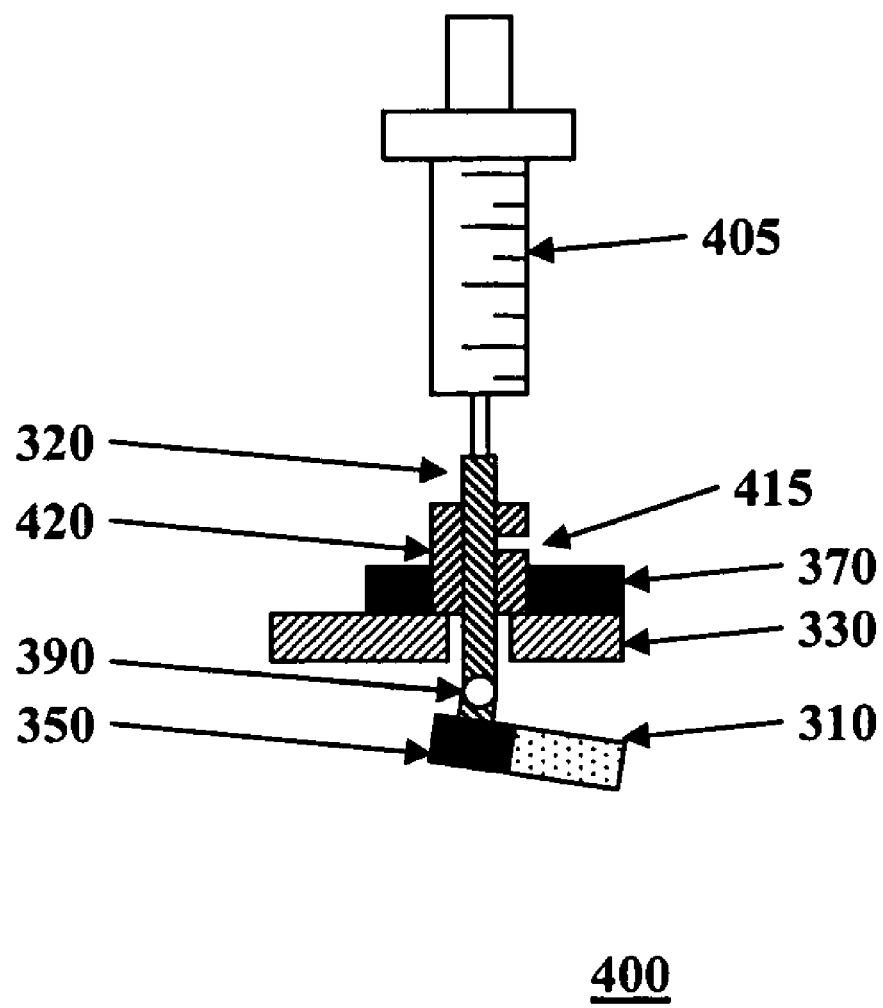
FIG. 5 illustrates a simple set screw type locking collar system in a flexed state according to an embodiment of the present invention.
Figure 8:
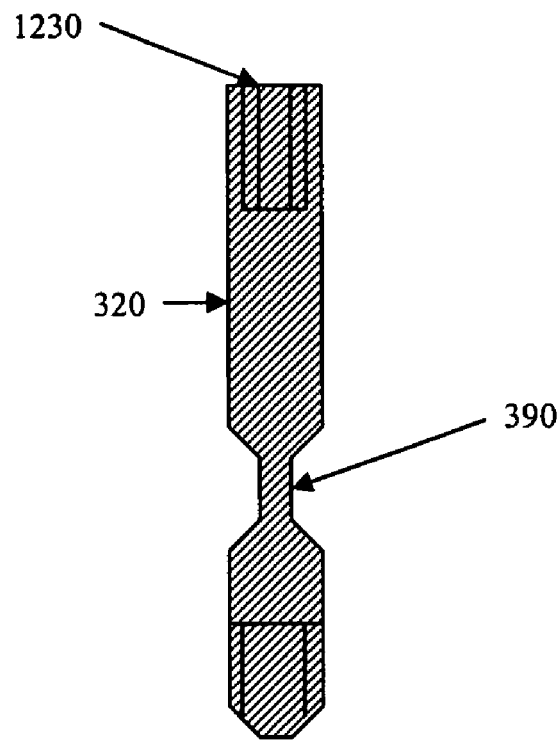
FIG. 8 illustrates a support post according to an embodiment of the present invention.

The support structures, illustrated as support posts 320, may be rigid and rigidly affixed to a support frame 350 or directly to the probe contractor substrate 310 or it may incorporate a flexible element 390, particularly at its base (near the support frame 350) to allow it to bend slightly and accommodate tip and tilt of the probe contractor substrate 310 while moving substantially vertically at the locking collar 380 (See FIG. 5). The flexible element 390 allows the top and the bottom of the support post 320 to bend slightly out of line taking up any angular misalignment between the locking collar 380 and the probe contractor substrate 310. The flexible element 390 of the support post 320 may be a section of the support post 320 that is machined to a thinner cross section for increased flexibility (as seen in FIG. 8), a flexure element cut into the post such as a hole or a notch, or a separate spring built into a multi-component post.

It should be noted that the support structure need not be rod or bar shaped, but rather may be any suitable shape to support the probe contractor substrate 310 including but not limited to a rod, a pin, a square post, a post with rectangular cross section, a post with hexagonal cross section, or a rib.

The support post 320 may be in tension or in compression during use depending on the construction of the probe card. If in tension (such tension force supplied by the vertical forces of a compressed interposer 340 for example), the support post 320 may be coupled to the support frame 350 which is coupled to the contractor substrate 310 or to the probe contractor substrate 310 directly. The support post 320 may be coupled to the support frame 350 or to the contractor substrate 310 by adhesives bonding, threading, or any other coupling means known in the art. However, for purposes of repair, a non-permanent attachment means, such as threading would be preferable. If in compression (for example if the interposer 340 is pre-compressed by an additional leafspring, or if a tension-mode vertical interposer is used), the support post 320 may simply contact the support frame 350 or the probe contractor substrate 310, preferably with ball ends. Ball ends provide optimal accuracy because there is a single well defined contact point between a ball and a plane. Any other post end (flat for example) contacts the plane of the substrate or frame at its edges at different points depending on the angle involved. Alternatively, the support posts 320 and the locking collar 380 may be designed so as to support lateral forces if required such as the locking collars 1020 discussed below and shown in FIGS. 12, 13, and 14.

Figure 20:
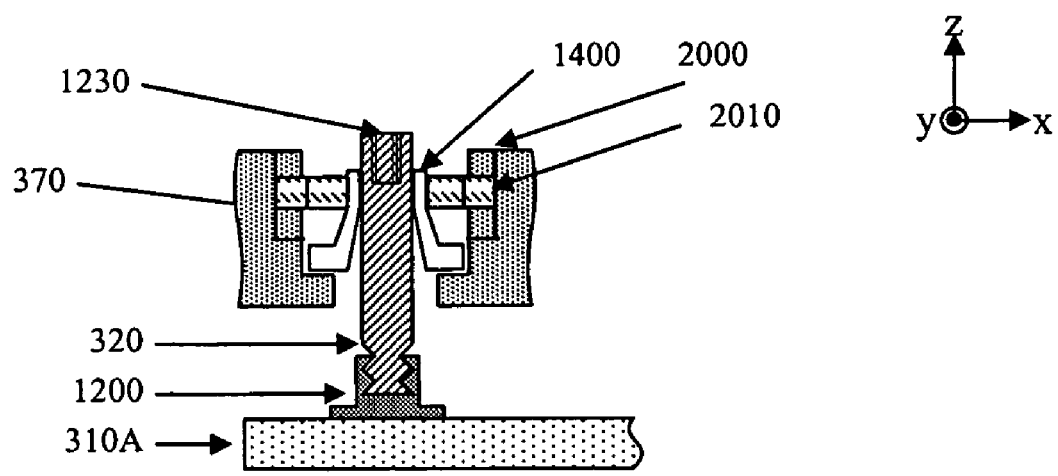
FIG. 20 illustrates a locking collar according to an embodiment of the present invention.

FIG. 20 illustrates a locking collar 380 that may incorporate a component such as a collet 1400 which may deform in order to secure the support post 320. In an embodiment of a collet locking collar, a threaded hole 2000 is cut in the stiffener 370 or PCB 330 (in FIG. 20, the hole is cut in the PCB 330 and an interposer that may be positioned between the probe contractor substrate 310 and the PCB 330 is not illustrated). The support post 320 may be vertically adjusted through this hole cut in the stiffener 370 or PCB 330 and the collet 1400 freely allows this vertical adjustment. Once the support post 320 has been positioned at the correct vertical height, a locking nut 2010 is threaded into the threaded hole 2000 and compresses the collet 1400, fixedly securing the support post 320 to the locking collar 380.

Figure 4:
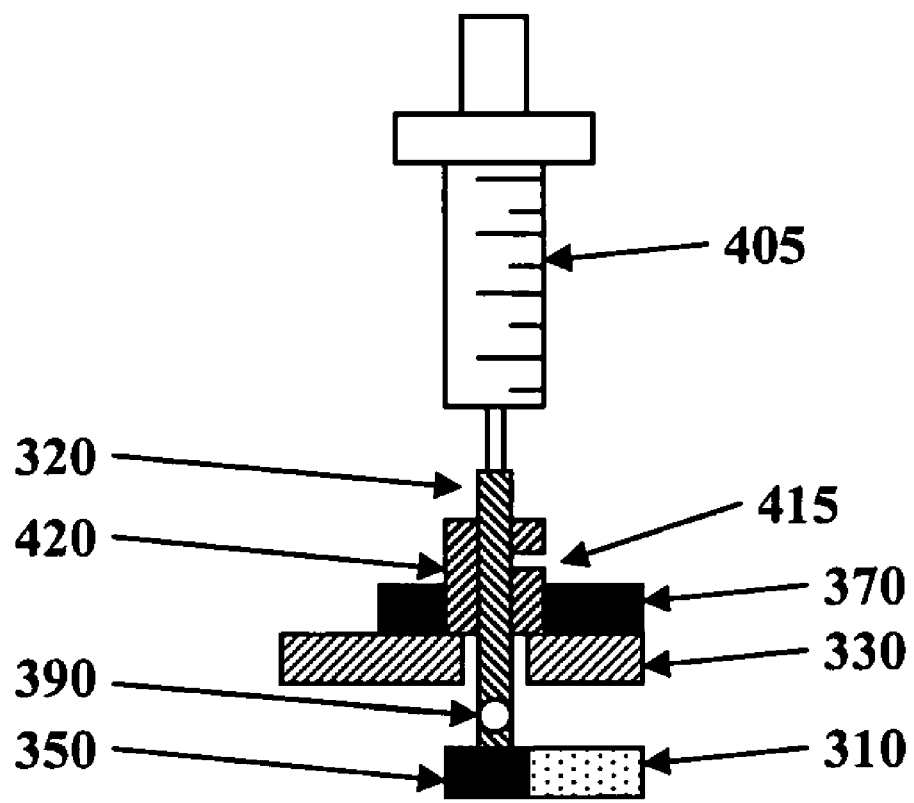
FIG. 4 illustrates a simple set-screw type locking collar system according to an embodiment of the present invention.

Alternate embodiments of the locking collar of the present invention may include a simple set-screw type locking collar arrangement 400 as illustrated in FIG. 4. As shown in FIG. 5, the support post 320 vertical position is adjusted by a temporary micrometer positioner 405 which is assembly tooling and not part of the probe card. The end shaft of the positioner 405 may simply push against the top of the support post 320 or it may be secured so as to be able to push or pull the support post 320 down and up (for example threaded into a hole in the top of the support post 320 (not shown)). Three support posts 320 are used to position the probe contractor substrate 310 during assembly (three points being the minimum required to define a plane). Once the probe contractor substrate 310 is positioned in the desired planar orientation, set screws (not shown) are inserted into set screw hole 415 to clamp the support post 320 into the support collar 420, which itself is firmly affixed to a stiffener 370. Alternatively, the support collar 420 may be affixed to any other reference mechanical element of the probe card 330. The set screw may employ a ball end, an anti-rotation insert or any other machine element known in the art to securely affix the support post 320 without causing unwanted motion of the support post 320 during tightening.

Figure 7:
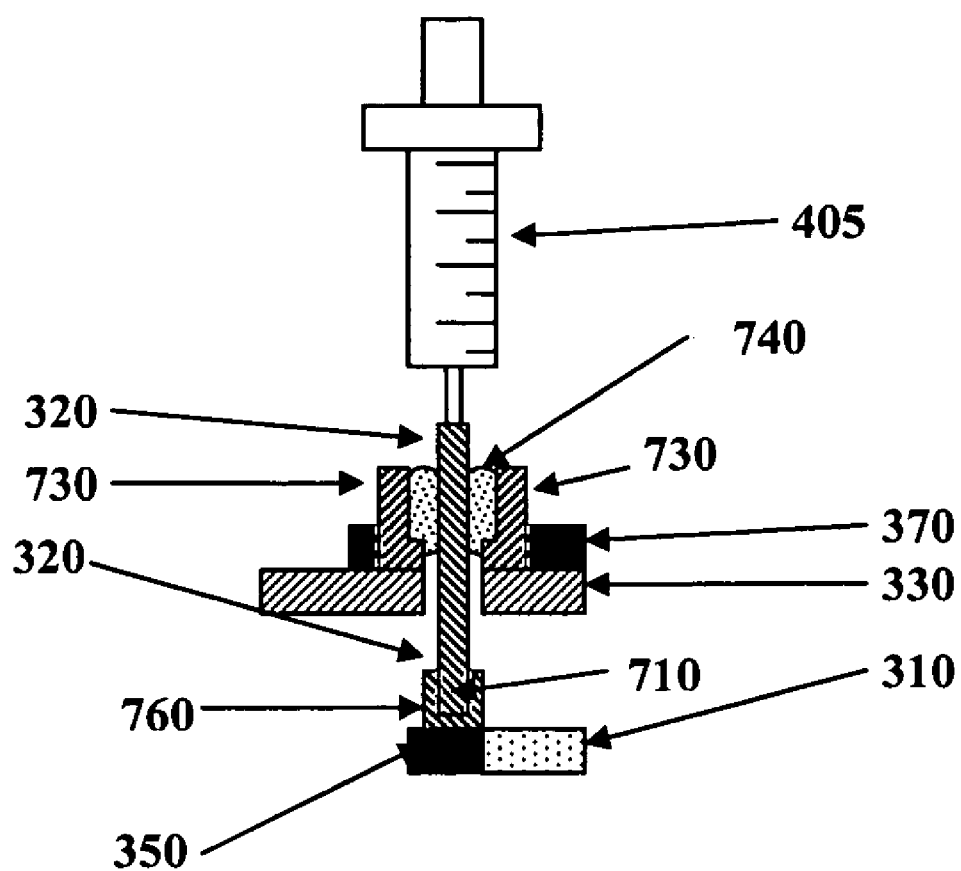
FIG. 7 illustrates a locking collar system according to an embodiment of the present invention.

FIG. 7 illustrates another locking collar system according to an embodiment of the present invention. The locking collar shown in FIG. 7 uses a permanent adhesive bond to attach the post in position. The support post 320 is bonded to the locking collar 730 using an adhesive material 740. However, the bonding may be accomplished by use of a solder or similar means which may include laser welding or any other means of bonding two components together known in the art. The locking collar 730 is threaded into the stiffener mount 370 (or other suitable mounting location on the probe card 330). The locking collar 730 provides a cavity designed to accept the support post 320, provide adequate adjustment range for the support post position, and accept adhesive for bonding the support post 320 to the locking collar 730. The support post 320 has a threaded end 710 that threads to a post receptacle 760 which is either integral to the support frame 350 or which is attached directly to the probe contractor substrate 310.

During assembly, the probe contractor substrate 710 is leveled as previously described, adhesive material 740 is dispensed and cured. The adhesive may be a two part cure system, a UV cure, a thermal cure or any other type of adhesive known in the art of adhesives. The threads between the support post 720 and post receptacle 760, and between the support collar 730 and the stiffener mount 750 are matched to one another such that the combined bonded support post/support collar pair can be conveniently removed and replaced should repair or manufacturing rework be required.

Further, it should be noted that the support frame 350 is a convenience and is not necessary. The support posts 320 may be mounted directly to the probe contractor substrate 310 or any other support structure which is affixed to the probe contractor substrate 310.

Figure 6:
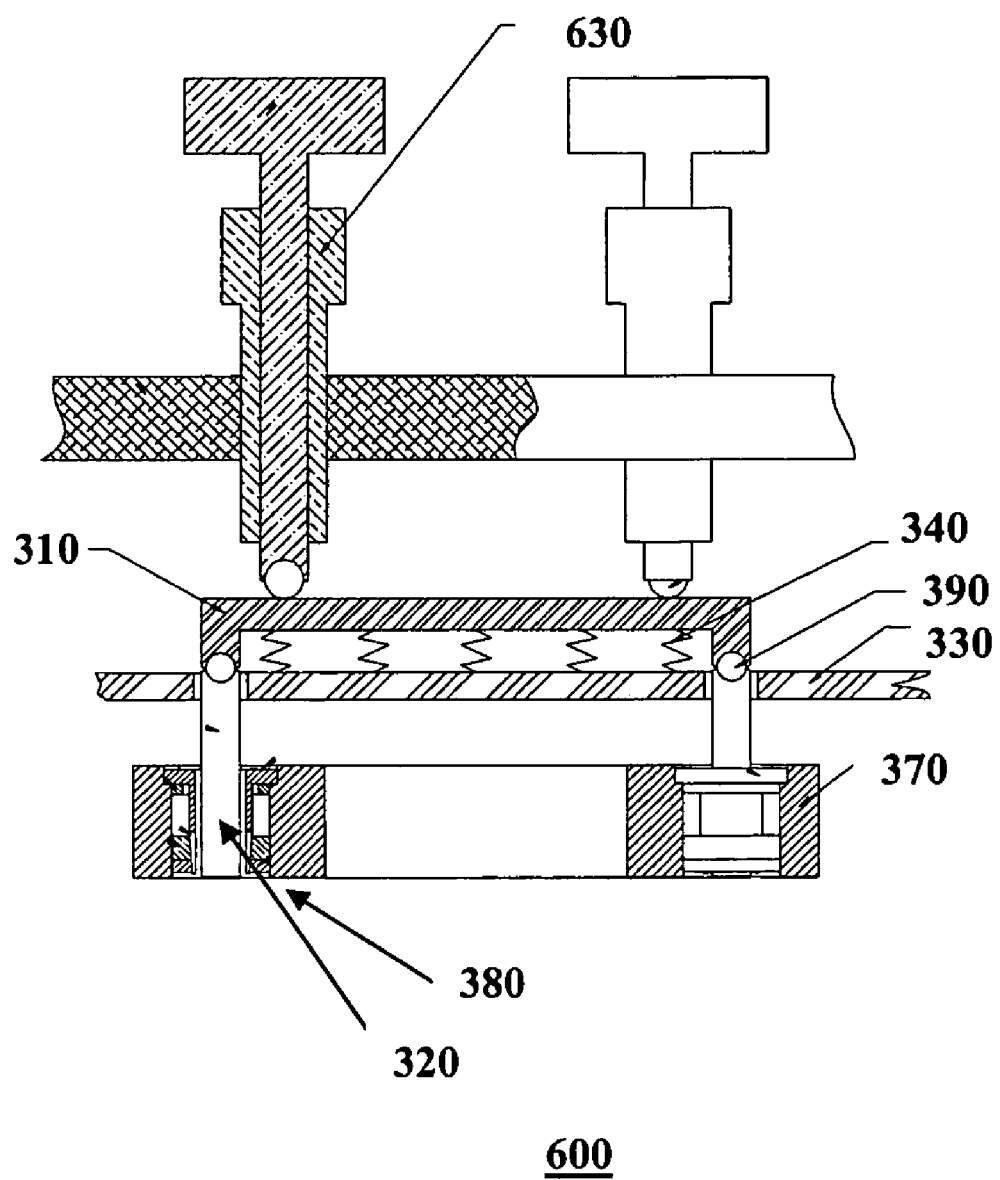
FIG. 6 illustrates a probe card assembly according to an embodiment of the present invention.

FIG. 6 illustrates a probe card assembly with attached alignment tooling according to an embodiment of the present invention. As shown in FIG. 6, the probe card assembly 600 includes locking collars 380, support posts 320, each of which is configured with a flexible joint 390 to accommodate a misaligned substrate. The probe card assembly 600 includes interposer springs 340 coupled to the PCB 330 and substrate 310. The locking collar 380 is mounted to stiffener 370 with a means for adjusting its position in the lateral (x and y) directions. Such a mount could be a screw mount with some small clearance in the screw holes allowing for a small degree of adjustment in the mount position. Micrometer tooling 630 in the x and y directions may also be employed in establishing the position of the locking collar 380 prior to tightening of the mounting screws. Micrometer tooling 630 bears on substrate 310 in at least three places adjusting the vertical position and orientation of substrate 310 prior to assembly.

The planarity may be measured during the alignment process prior to assembly by any suitable means such as gauges or optical means as discussed below in reference to FIG. 19.

Figure 9:
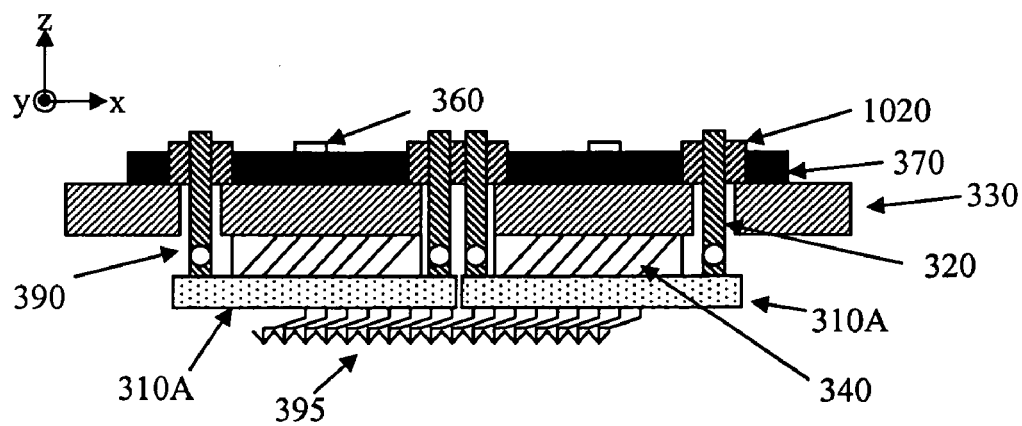
FIG. 9 illustrates a fixed multi-substrate probe card assembly according to an embodiment of the present invention.

As discussed earlier, in some embodiments, it is preferable to have multiple "tiles" of probe substrates, instead of one large probe substrate. FIG. 9 shows a probe card assembly which includes multiple contractor-bearing substrates 310A fixed to a mechanical super-structure, in this case the locking stiffener ring 370. The contractor bearing substrates 310A are similar to the contractor substrate 310 with the exception that they are generally smaller than the contractor substrate 310. However they serve the same purpose, which is to provide a substrate bearing the probe contactors 395. Note that in FIG. 9 and all subsequent figures, the three Cartesian axes are indicated as shown. In relation to the Cartesian axes, the rotational nomenclature is as follows: Tip is defined as the rotation around the x axis; Tilt is around the y axis; and Yaw is around the z axis. It may be easier to understand this in reference to the two dimensional drawing as: Tip means, from the viewing angle of FIG. 9, that structures that are more "embedded" in the page are tipped up and structures closer to the surface of the page are tipped down (or vice versa); Tilt means that structures on the left of the page are tilted up and structures on the right of the page are tilted down (or vice versa); and Yaw means that the structures are rotated so that structures on the left come out of the page and structures on the right go into the page (or vice versa).

The locking collars 1020, which will be detailed below, each provide six degrees of freedom (tip, tilt, rotation, x, y and z) allowing the substrates 310A to be precisely positioned relative to the probe card reference points 360 and from one substrate 310A to another substrate 310A, prior to locking (by mechanical, adhesive, solder or similar means as will be further detailed) the support posts 320 in place. The compliant interposer 340 may be any interposer known in the art including spring pin arrays, spring arrays, ZIF connectors, lateral interposers, rubberized conductive interposers and the like. The primary definition of the compliant interposer 340 is that it provides electrical connection between corresponding terminals on the substrates 310A and the PCB 330 (which may be any sort of multi-layer wiring board, not just a printed circuit board) on a one-to-one basis while affording enough compliance to accommodate the required range of motion between the substrate 310A and the PCB 330 during alignment prior to fixing.

The substrates 310A themselves may be multi-layer wiring boards including Ceramics (Low Temperature Cofired Glass-Ceramics "LTCC"; High Temperature Cofired Ceramics "HTCC"; Multi-Layer Organic Space Transformers "PCB" or "MLO"; Plugged via substrates including dielectric coated silicon, quartz, ceramic, etc.) all known in the art of probe cards and electronic packaging. Advantageous features of the substrates are that they provide: a stable mechanical platform on which the probe contactors 395 are affixed; electrical connection between terminals on the top surface, and terminals on the bottom surface or on the top surface; optionally, some degree of signal re-distribution (also called "space transformation"); optionally, some degree of ground and power plane; and optionally, bypass capacitors and or other passive or active electronic components that are either integral to the substrate or affixed thereon.

The "stiffener ring" 370 is a mechanical element that provides stiffness for the PCB 330. Optionally, it may provide the mounting points 360 which form the "datum" or reference plane for mounting the probe card 330 (and to which contractor tip location is referenced).

Figure 10:
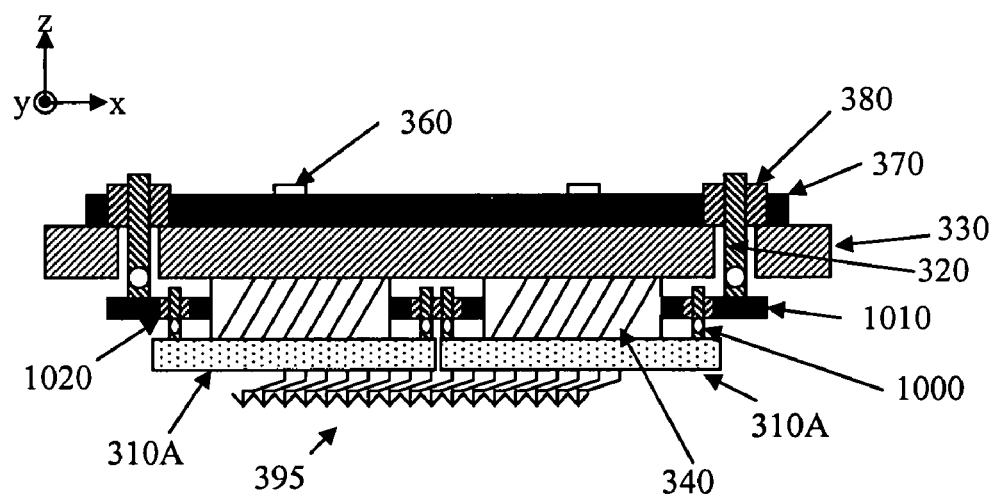
FIG. 10 illustrates a fixed multi-probe card assembly with a sub-mount according to an embodiment of the present invention.

FIG. 10 shows another embodiment of the proposed assembly. In this embodiment, a superstructure or sub-mount 1010 is provided, to which the substrates 310A are affixed via the support posts 1000. The sub-mount 1010 has a generally flat shape with machined features accepting the primary locking collars 1020, and openings through its surface for the interposer 340 connector to pass signals from the substrates 310A to the PCB 330. The substrates 310A are aligned to one another during the mounting process so that the individual tips of probe contactors 395 are brought into a best-fit plane relative to one another, and into x and y position relative to one another. This alignment will be described in more detail later. The substrates 310A are mounted to the sub-mount 1010 by an arrangement of primary support posts 1000 and primary locking collars 1010, which will be described in more detail later. Once the substrates 310A are aligned relative to one another and affixed to the sub-mount 1010 (which is made of a strong material that is thermally engineered to be matched to the wafer under test in the particular tester environment) the sub-mount 1010 is leveled to the probe card 330 reference plane (either created by the reference mounting points 360 or the plane of the PCB itself) and fixed in place by the secondary support posts 320 and secondary locking collars 380. Generally, sub-mount 1010 would be affixed to the PCB 330 by using at least three or preferably four support posts 320 and secondary locking collars 380.

In real-world test conditions, the wafer 1120 (see FIG. 11) is heated (or cooled) on a prober's wafer chuck 1110, which is presented under the probe card assembly. Due to thermal conductivities and heat transfer conditions present in the test cell, there is a natural thermal gradient from the wafer surface through the probe card in the z direction.

Figure 11:
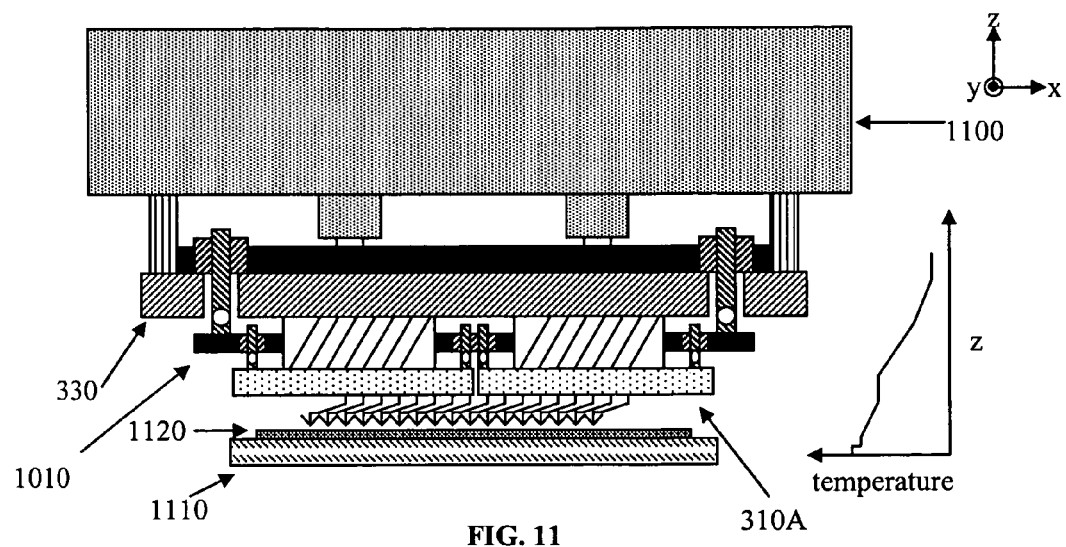
FIG. 11 illustrates a thermal profile of a probe card assembly according to an embodiment of the present invention.

FIG. 11 shows schematically a possible temperature profile starting from the wafer chuck 1110 (in this case above ambient temperature) and progressing through the probe assembly thickness to the test head 1100, which is nearer to ambient temperature. An example of data for a 150° C. chuck 1110 temperature shows the contractor substrates 310A at 130° C., the sub-mount 1010 at 100° C. and the probe card PCB 330 upper surface at 60° C.

Since the probe contactors 395 must be precisely aligned to the wafer's 1120 probe pads (with a typical tolerance of ±5 μm, it is desirable to provide a probe card 330 which is well thermally matched to the silicon wafer. The thermal gradient through the structure of the probe card assembly is a complicating difficulty in achieving thermal matching but can be included in the thermal expansion engineering calculations. In any case, it is generally desirable to have contractor substrates 310A that are closely matched to silicon (as wafers are generally constructed from silicon). Certain ceramics, metals, glass-ceramics and of course silicon meet this requirement. Since the sub-mount 1010 provides the global (or substrate-to-substrate) alignment, it is also desirable to provide a sub-mount material that has a low Thermal Expansion Coefficient (TEC) but somewhat higher than silicon and ceramic to compensate for the intermediate temperature of the sub-mount 1010 (since the sub-mount is at a lower temperature than the wafer 112, it should have a higher TEC so that the total length expansion at a given x-y location of the sub-mount and the wafer are equal). Additional desirable characteristics are mechanical strength to avoid bowing or warping under interposer loads and probing loads, and ease of machining or fabrication. Certain metals such as stainless steel, tungsten composites, and nickel alloys among others provide these desirable characteristics. Other available, but less desirable alternatives, include powder formed ceramics, and machineable ceramics.

The function of the primary locking collar 1020 and support post 1000 assembly is to provide a means of fixing a substrate 310A to the sub-mount 1010 (or the stiffener ring 370 as is sometimes the case; in regards to discussing various properties of the locking collars and the stiffener ring 370, the terms "stiffener ring" 370 and the "sub-mount" 1010 may be used interchangeably) in a precise, stable position and orientation. Three or more collar 1020 and support posts 1000 sets may be used to secure a substrate 310A (given that at least three points are needed to define a plane). The preferred number of sets of collars/posts 1020/1000 is four per substrate 310A, each one supporting a corner of the substrate 310A. The primary locking collars 1020 provide six degrees of freedom (tip, tilt, yaw, x, y, z) for the positioning of the substrate 310A. The range of alignment motion is determined by the as-fabricated tolerance of the various components. Typical x, y and z range will be on the order of 50 to 100 µm (this includes yaw adjustment of the substrate). Tip and tilt range will be on the order of 50 or 100 arc-seconds.

The locking collars 1020 provide for free movement of the substrate 310A relative to the sub-mount 1010 during alignment and must provide for a stable fixed mounting once aligned. Preferably, but not necessarily, the collar 1020 and stud 1000 assembly should be re-workable once secured, either by mechanical disassembly or by removal and replacement.

Various locking mechanisms 1020 can be used to meet this function, several of which are described in the subsections below.

Figure 12:
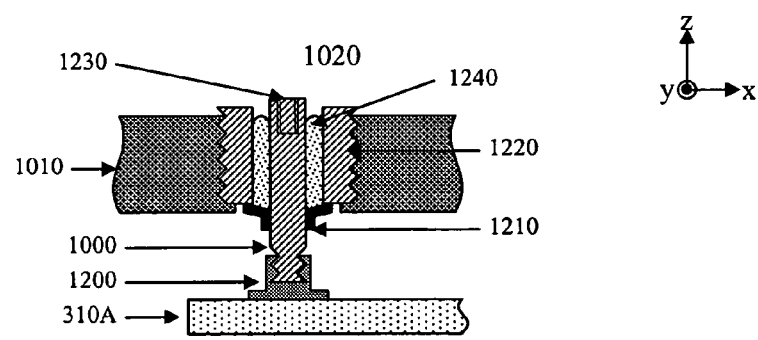
FIG. 12 illustrates a bonded locking collar according to an embodiment of the present invention.

FIG. 12 shows an adhesive locking collar 1020. A threaded insert 1200 is provided on the contractor substrate 310A (or the substrate frame if present) to secure the substrate 310A to the post 1000. The threads on the post 1000 and insert 1200 match the threads on the collar insert 1220 so that the bonded assembly can be removed as a unit. The collar 1220 threads into the sub-mount 1010 or stiffener 370 (depending on whether a sub-mount 1010 is present) and provides sufficient clearance between its inner diameter and the support post's outer diameter for the full required range of x, y, tip and tilt motions. For example, the post 1000 may have an outer diameter of 4 mm and the collar 1220 may have an inner diameter of 5 mm. A rubber flex seal 1210 may be used to constrain the adhesive 1240 prior to curing. In the case that solder or some other bonding agent (brazing metal for example) is used, the rubber seal 1210 may not be necessary.

The threaded hole 1230 in the top of the post 1000 is provided so that tooling can be attached to the top of the post 1000, which tooling is used to precisely orient the contractor substrate 310A and hence the probe tips of the probe contactors 395 on the substrate 310A in space relative to some mechanical datum on the sub-mount 1010 or stiffener 370 (such as the reference points 360, or the plane of the PCB 330). This top-of-post tooling point is advantageous versus the alternative of holding the contractor substrate 310A itself during alignment because such direct substrate 310A holding can impart forces on the substrate 310A which cause unwanted deformation and deformation relaxation after bonding or locking of the locking collar 1020. Holding the post 1000 from the top may also impart unwanted forces on the substrate 310A, but these forces will be locked into place and will not relax after locking and removal of the tooling.

Figure 13:
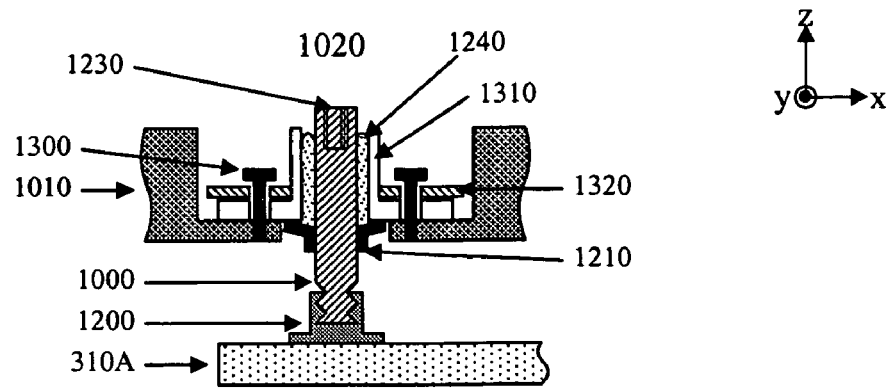
FIG. 13 illustrates another bonded locking collar according to an embodiment of the present invention.

FIG. 13 shows another embodiment of the bonded locking collar 1020 which provides a thinner adhesive 1240 bondline and hence improved thermal and mechanical stability (since adhesives or solders can creep at high temperatures and have higher thermal expansion coefficients than metals and ceramics). Thus it is desirable to minimize the thickness of the adhesives 1240 or bonding agents employed. In this embodiment, the sliding collar 1310 facilitates the x and y motion range required for alignment (by sliding in the sub-mount cavity prior to being secured by the mounting screws 1300), and the adhesive 1240 bond takes up the z component and any tip and tilt component of adjustment range. A washer 1320 may be added to isolate the collar 1220 from the torque or disturbance that occurs when tightening a screw 1300.

The typical dimensions of the a locking collar 1020 used in reference to lock a support post 1000 to a sub-mount 1210 is on the order of 1 cm in overall diameter, but they can be any size appropriate for their function.

Figure 14:
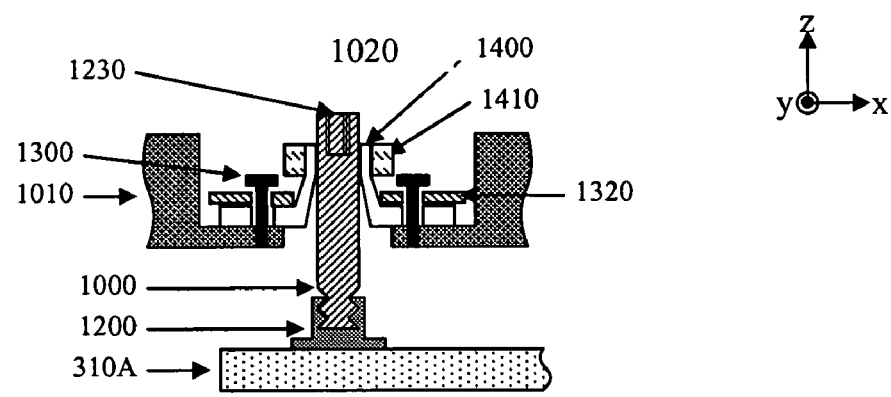
FIG. 14 illustrates another mechanical locking collar according to an embodiment of the present invention.

FIG. 14 shows a representative example of a mechanical locking collar 1020 with the six degrees of freedom for this application. The locking collet 1400 is free to move in x and y directions prior to tightening of the mounting screws 1300, while the locking collet 1400 allows the post to move in z, tip and tilt prior to tightening of the collet locking collar 1410, which squeezes the top of the locking collet 1400 into tight engagement with the post 1000. Such a mechanical arrangement is only one example of a wider range of mounts which can be employed for this application, including split ball collet arrangements and the like, all of which are known in the art of mechanical design.

The secondary locking collars 380 and pins 320 (as shown in FIG. 10) are used to secure the sub-mount 1010 assembly to the probe card 330 in a planarized manner as was discussed earlier. The construction of the secondary locking collars 380 may be of the kind discussed earlier and shown in FIGS. 4 and 7, or they may be constructed in the same fashion as the primary locking pins 1020 and shown in FIGS. 12, 13, and 14. Similarly, the secondary pins 320 may be of one of the embodiments shown in FIG. 4 or 7, or they may also be the embodiment shown in FIG. 12.

Figure 15:
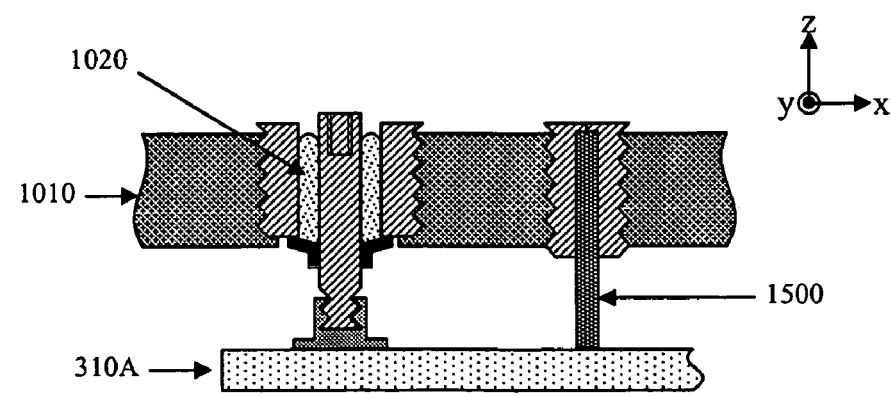
FIG. 15 illustrates an embodiment of the present invention which includes support pins.

Vertical support pins 1500 (as shown in FIG. 15) may be used to additionally support the contractor substrate 310A against vertical (positive z direction) forces generated during touchdown of the probe card to a wafer 1120. The pins 1500 may be flat ended dowel pins which are in close contact to the substrate 310A but not connected to the substrate 310A. The pins 1500 may be of a diameter small enough not to interfere with the area required for interposer 340 connections between the substrate 310A and the PCB 330. For example, if the pin 1500 is substantially the same in diameter to the scribe street width (the area between adjacent die on a wafer devoted to scribing or dicing the wafer) then the pins 1500 can be placed in the corners between die on a periodic basis to support the central areas of the contractor substrate 310A. It should be noted that these vertical support pins 1500 play no role in planarizing the substrate(s) 310A in space relative to one another or to the probe card 330. The pins 1500 simply provide vertical support so that improved planarity can be maintained during touchdown of the contractor array. The pins 1500 may be press-fit into the sub-mount 1010 or screwed into the sub-mount 1010. The embodiment of FIG. 15 shows a pin 1500 that is screwed into the sub-mount 1010. The pin 1500 in this case may be screwed down until it just contacts the surface of substrate 310A.

Support Posts 1000 may be attached to the substrate 310A in a manner that provides excellent thermal stability as well as mechanical precision without overly stressing the relatively brittle substrate material 310A, which is typically a ceramic or glass-ceramic. It is also advantageous for support posts 1000 to be attached to the substrates 310A in a manner that allows easy removal for replacement of the support post 1000. One such attachment means is shown in FIG. 16.

Figure 16:
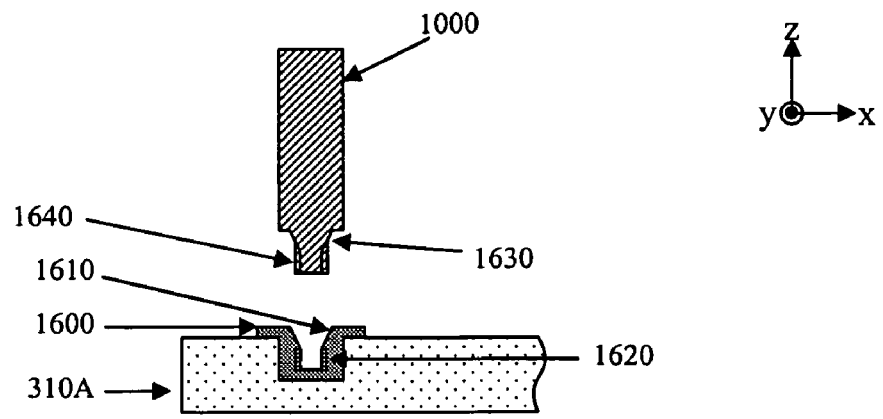
FIG. 16 illustrates a substrate-to-post attachment means according to an embodiment of the present invention.

In FIG. 16, a substrate mount insert 1600 is bonded into a blind hole in the Interposer side surface of the contractor substrate 310A. The bond may be made with adhesive, glass, solder, or braze as well as any other attachment technique known in the art. The insert 1600 may be metal or ceramic but metal is preferred for its machinability and strength. Possible metals include stainless steel, Invar, Covar, steel, brass, etc. In one embodiment, the insert has a feature such as a conical seat surface 1610 which mates to a matching feature 1630 on the end of the post shaft 1000 to provide a positive stable locking location when the post shaft 1000 is screwed into the insert 1600 (using the threaded area 1620 of the insert 1600 and the threaded end 1640 of the post 1000). Other configurations may be used as sell, but the one as described demonstrates desirable features.

Four substrates 310A may be assembled to a sub-mount 1010 to provide a larger active probable area. It is desirable that the four substrates 310A be abutted closely to one another so that all die on a wafer 1120 can be probed simultaneously without skipping a column or row of die. To achieve this end, the probe contactors 395 are placed very close to the two inside edges of each substrate 310A. Furthermore, the distance between the adjacent substrates 310A is less than the scribe street width (which is on the order of 100 μm wide) assuming that the probe contactors 395 do not overhang the substrate 310A in any way. This can be achieved by dicing (diamond wheel cutting) the substrate 310A close to the probe contactors 395 which dicing would typically be performed after the probe contactors 395 are fabricated on the substrate 310A.

Another issue arises in that it is necessary for the substrates 310A to be adequately supported so that probing forces do not cause unwanted deformation of the substrate 310A. In practice, such support is necessary in at least one place on each edge of a substrate 310A. Thus, support posts 1000 should be attached in at least four locations per substrate 310A. As a result, a location for the central support(s) 1000 (the posts 1000 which will be in the "middle" of the probing area as opposed to the posts 1000 near the edge of the probing area) must be provided such that the posts 1000 do not interfere with interposer contacts 1810 (see FIG. 18). This may be accomplished by using a space-transformer as a probe substrate 310A and routing the signal traces from the probe contactors 395 away from the center in a diagonal manner to the interposer contacts 1810 as shown in FIG. 17.

Figure 17:
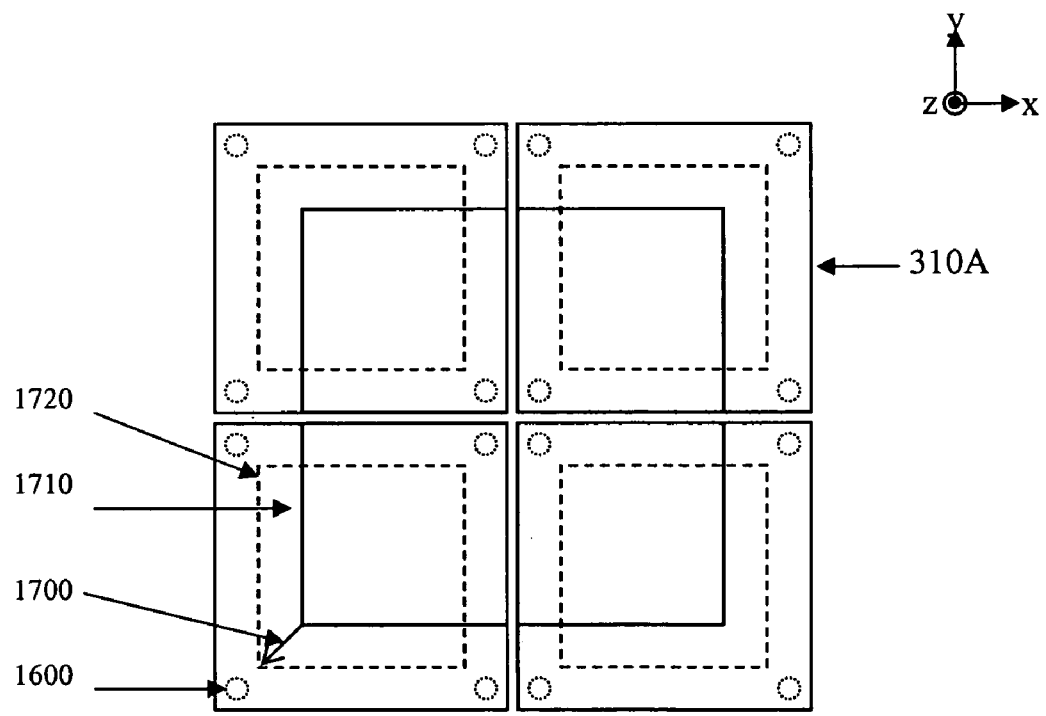
FIG. 17 illustrates four substrate segments oriented as they would be in a segmented assembly.

FIG. 17 shows four substrate segments 310A oriented as they would be in a segmented assembly. The sub-mount 1010 is not shown for clarity. The view in FIG. 17 is from the probe contractor 395 side of the substrates 310A. The Probe Active Area 1710 is shown as a solid square extending completely to the two inside edges of each substrate 310A. The dashed line shows the interposer contact area 1720 on the other side of the substrate 310A, which is offset diagonally by the routing vector 1700 distance and direction. This offset routing provides room for the inner substrate mount insert(s) 1600 shown as dotted circles on the interposer side of the substrates 310A.

Figure 18:
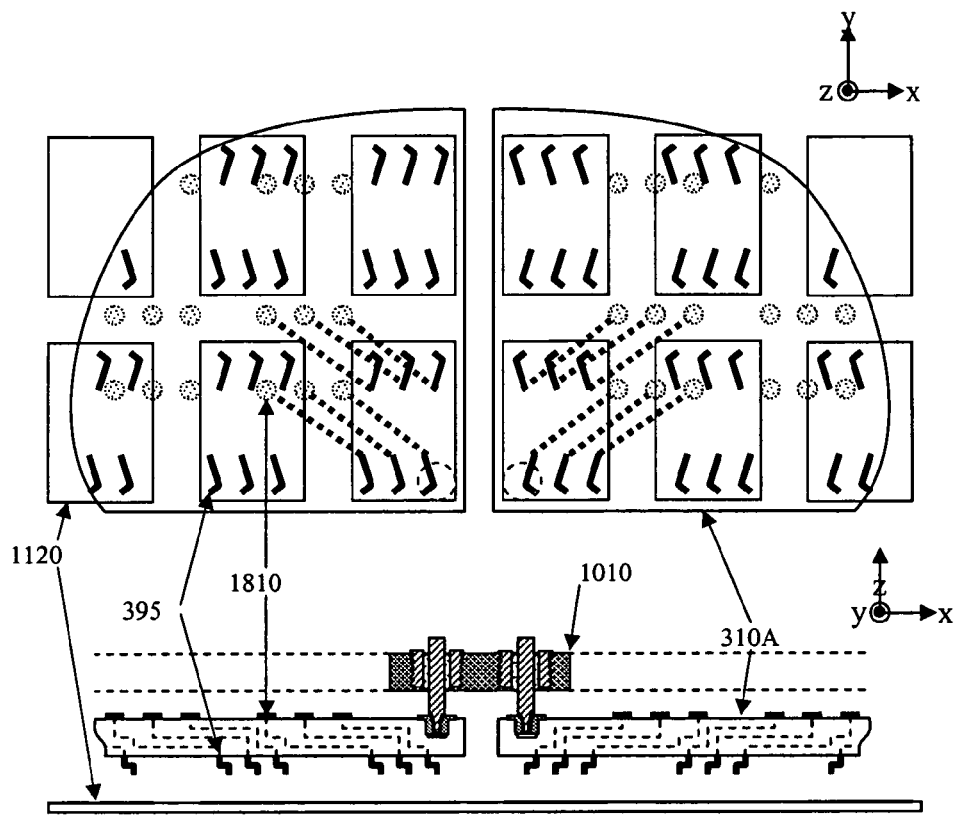
FIG. 18 illustrates a bottom view of a sub-mount assembly according showing trace routing according to an embodiment of the present invention.

FIG. 18 shows a close-up of the inner corner of two substrates as assembled, and depicts that the posts 1000 do not interfere with the traces from the probe contactors 395 to the interposer contacts 1810.

In the process of assembling a segmented probe card, it is necessary to align in space the substrate segments 310A relative to one another and to the sub-mount 1010. The alignment tolerance relative to the sub-mount 1010 is relatively coarse and is set by the compliance and range of the interposer 340 (on the order of ±100 μm). The alignment tolerance between one substrate segment 310A and an adjoining substrate segment 310A is extremely fine and is set by the tip position accuracy specifications of the assembled probe card. Typically the substrate-to-substrate alignment accommodates a relative x and y position tolerance of ±5 μm, and a z position tolerance of 10 μm as measured from the tip of any probe contractor 395 to any other tip of a probe contractor 395.

In performing such an alignment, it may be helpful to use a glass mask 1900 (see FIG. 19) as the master reference. The mask 1900 is placed under the substrates 310A in the assembly with camera microscopes 1910 looking up through the glass at specific tips of probe contactors 395, preferably on the corners of each substrate 310A. The glass mask 1900 has alignment fiducial marks (typically chrome thin film patters on the glass) in the ideal location of the tips of the probe contactors 395 to be used for alignment. An alternate to the use of mask 1900 as an alignment master is to use an optical coordinate measurement system such as a Mitutoyo model QV-404.

Alignment and mounting of the substrates to the sub-mount can be accomplished in the following sequence:

1. Coarse align (to a tolerance of ±50 μm) the sub-mount 1010 to the mask 1900 in x, y, tip, tilt, yaw and z.
2. Fine align one substrate's 310A probe contractor 395 tip pattern to the corresponding fiducials on the mask 1900 in x, y, tip, tilt, yaw and z. This is preferably done using cameras 1910 and a six-axis manipulator 1930 as discussed below.
3. Bond or lock the primary locking collars 1020 for the aligned substrate 310A.
4. Repeat steps 2-3 for all remaining substrates 310A.

Figure 19:
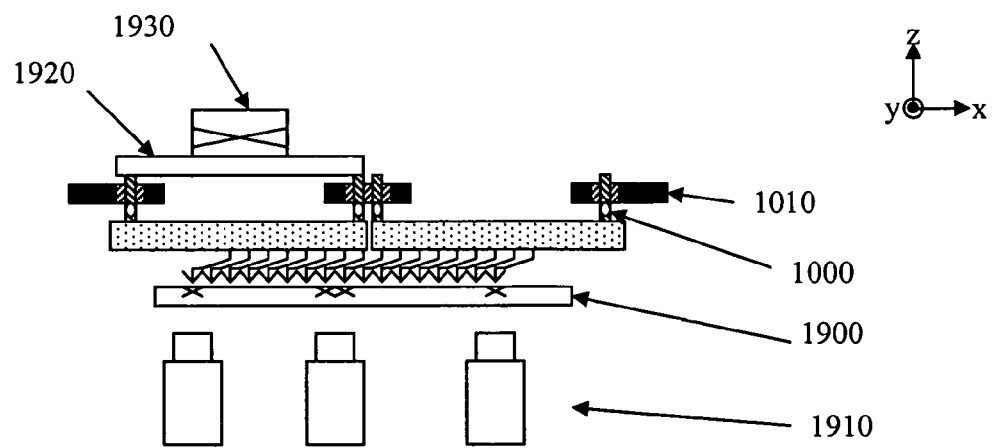
FIG. 19 illustrates a method of aligning a multiple substrate sub-assembly.

The alignment tooling consists of the elements shown in FIG. 19. Of course other configurations are possible and should not limit the scope of the claims.

The cameras 1910 are upward looking microscopic cameras of sufficient magnification to resolve the aligned tip of a probe contractor 395 and mask 1900 fiducial mark for approximately 5 μm positioning. At least three cameras 1910 are used per substrate 310A location in order to position the substrate 310A in all 6 axes (each camera provides x, y and z alignment to the mask fiducial in a given location). The alignment mask 1900 is transparent except for fiducial marks as already described. The substrate sub-mount 1010 is secured to the same support tooling as the alignment mask 1900 and the cameras 1910. The first substrate 310A to be aligned is clamped to a substrate handle web 1920 or plate by attaching the tops of the substrate mounting posts 1000 to the handle 1920. The handle 1920 is fixed to a 6-axis manipulator stage 1930 and is moved into position relative to the mask 1900 as already described. Finally, the posts 1000 are bonded to the sub-mount 1010 and the next substrate 310A is aligned. By minimizing the x and y position error of two diagonally opposed tips relative to their fiducials, the x, y, and yaw axes can be aligned. The tip, tilt and z axes can be aligned by minimizing the z position error of three tips of probe contactors 395 on the substrate 310A (the three tips defining a plane). Z tip location can be determined through microscope focus (at sufficiently high magnification, focus can be used to find tip location within a few microns). Alternative methods of finding z tip location include light contact to the glass mask 1900, which will show interference fringes at the contact point, and electrical contact of a tip of a probe contractor 395 to an energized contact pad on the mask 1900. It should be noted that this description of the alignment process is just an example and other ways to perform the alignment may be used.

While the description above refers to particular embodiments of the present invention, it will be understood that many alternatives, modifications and variations may be made without departing from the spirit thereof. The accompanying claims are intended to embrace such alternatives, modifications and variations as would fall within the true scope and spirit of the present invention. The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A probe card assembly comprising:
   a first probe contactor substrate having a first plurality of probe contactor tips and a second probe contactor substrate having a second plurality of probe contactor tips;
   a probe card wiring board;
   an interposer disposed between and electrically coupled to the first probe contactor substrate and the probe card wiring board;
   a sub-mount disposed between the probe card wiring board and the first and second probe contactor substrates;
   a first support post for adjusting the first probe contactor substrate, the first support post being adjustable along its x-axis, its y-axis, and its z-axis and for tilt, tip, and yaw, until secured;
   a first lock for fixedly securing an end of the first support post in a fixed position, coupled to the sub-mount, wherein the fixed position is one in which a plane of the first plurality of probe contactor tips is co-planar with a plane of the second plurality of probe contactor tips;
   a second support post for adjusting the sub-mount substantially vertically, the second support post being vertically adjustable until secured; and
   a second lock, coupled to a mounting structure, for securing an end of the second support post in a fixed position, wherein the fixed position is one in which a plane of the first plurality of probe contactor tips is substantially parallel to a predetermined reference plane.

2. The probe card assembly of claim 1 wherein the first lock allows the first support post to be moved along its x-axis, its y-axis, and its z-axis and for tip, tilt, and yaw prior to fixedly securing the first support post in a fixed position.

3. The probe card assembly of claim 2 wherein the first lock allows the first support post to be moved along its x-axis, its y-axis, and its z-axis approximately 50 μm.

4. The probe card assembly of claim 2 wherein the first lock allows the first support post to be moved along its x-axis, its y-axis, and its z-axis approximately 100 μm.

5. The probe card assembly of claim 2 wherein the first lock allows the first support post to be tipped or tilted approximately 100 arc-seconds.

6. The probe card assembly of claim 2 wherein the first lock allows the first support post to be tipped or tilted approximately 50 arc-seconds.

7. The probe card assembly of claim 1, wherein the reference plane is a plane of the probe card wiring board.

8. The probe card assembly of claim 1 wherein the reference plane is a plane determined by a plurality of reference points.

9. The probe card assembly of claim 1, wherein the second support post includes a flexible region to accommodate angular misalignment of the sub-mount with respect to the reference plane.

10. The probe card assembly of claim 9 wherein the flexible region is a thinned portion of the support post.

11. The probe card assembly of claim 9 wherein the flexible region is a spring element.

12. The probe card assembly of claim 1, wherein the first lock is a set screw locking collar.

13. The probe card assembly of claim 12, wherein the set screw locking collar includes a support collar having an aperture through which to receive a set screw to securely affix the vertical position of the support post.

14. The probe card assembly of claim 1, wherein the lock includes a collet.

15. The probe card assembly of claim 1, wherein the first lock is an adhesive bonded locking collar.

16. The probe card assembly of claim 1 wherein the first support post is coupled to the probe contactor substrate.

17. The probe card assembly of claim 1 wherein the first support post and the first lock are removable from the probe card assembly after the first support post has been fixedly secured by the first lock.

18. A probe card assembly comprising:
    a first probe contactor substrate having a first plurality of probe contactor tips and a second probe contactor substrate having a second plurality of probe contactor tips;
    a probe card wiring board;
    an interposer disposed between and electrically coupled to the first probe contactor substrate and the probe card wiring board;
    a first support structure contacting the first probe contactor substrate, the first support structure being adjustable along its x-axis, its y-axis, and its z-axis and in tilt, tip, and yaw, until secured; and
    a first lock for securing an end of the first support structure in a fixed position.

19. The probe card assembly of claim 18 wherein the first lock allows the first support structure to be adjusted along its x-axis, its y-axis, and its z-axis and for tip, tilt, and yaw prior to fixedly securing the first support structure in a fixed position.

20. The probe card assembly of claim 19 wherein the first lock allows the first support structure to be moved along its x-axis, its y-axis, and its z-axis approximately 50 μm.

21. The probe card assembly of claim 19 wherein the first lock allows the first support structure to be moved along its x-axis, its y-axis, and its z-axis approximately 100 μm.

22. The probe card assembly of claim 19 wherein the first lock allows the first support structure to be tipped or tilted approximately 100 arc-seconds.

23. The probe card assembly of claim 19 wherein the first lock allows the first support structure to be tipped or tilted approximately 50 arc-seconds.

24. The probe card assembly of claim 18 further including a sub-mount and wherein the first lock is removably coupled to the sub-mount.

25. The probe card assembly of claim 24, further including a second support structure for adjusting the sub-mount substantially vertically and wherein the second support structure includes a flexible region to accommodate angular misalignment of the sub-mount with respect to a reference plane.

26. The probe card assembly of claim 25 wherein the flexible region is a thinned portion of the support structure.

27. The probe card assembly of claim 25 wherein the flexible region is a spring element.

28. The probe card assembly of claim 18, wherein the first lock is a set screw locking collar.

29. The probe card assembly of claim 28, wherein the set screw locking collar includes a support collar having an aperture through which to receive a set screw to securely affix the vertical position of the support structure.

30. The probe card assembly of claim 18, wherein the lock includes a collet.

31. The probe card assembly of claim 18, wherein the first lock is an adhesive bonded locking collar.

32. The probe card assembly of claim 18 wherein the first support structure is coupled to the probe contactor substrate.

33. The probe card assembly of claim 18 wherein the first support structure and the first lock are removable from the probe card assembly after the first support structure has been fixedly secured by the first lock.

34. The probe contactor assembly of claim 18 wherein the first lock is removably coupled to the probe card wiring board.

35. The probe contactor assembly of claim 18 further including a stiffener coupled to the probe card wiring board.

36. The probe contactor assembly of claim 35 wherein the first lock is removably coupled to the stiffener.

37. The probe card assembly of claim 18 wherein the fixed position is one in which a plane of the first plurality of probe contactor tips is substantially co-planar with a plane of the second plurality of probe contactor tips.

38. The probe card assembly of claim 18 wherein the fixed position is one in which a Plane of the first plurality of probe contactor tips is substantially co-planar with a plane of the second plurality of probe contactor tips and a plane of the first plurality of probe contactor tips is substantially parallel to a reference plane.

39. The probe card assembly of claim 38, wherein the reference plane is a plane of the probe card wiring board.

40. The probe card assembly of claim 38 wherein the reference plane is determined by a plurality of reference points.

* * * * *